3,408,191
Patented Oct. 29, 1968

3,408,191

PROCESS OF DOUBLE EXPOSING A PHOTOPOLYMERIZABLE STRATUM LAMINATED BETWEEN TWO SUPPORTS, SAID DOUBLE EXPOSURE DETERMINING THE SUPPORT WHICH RETAINS THE POSITIVE IMAGE

William Jeffers, Fair Haven, N.J., assignor to E. I. du Pont de Nemours and Company, Wilmington, Del., a corporation of Delaware No Drawing. Filed Oct. 28, 1964, Ser. No. 407,245
16 Claims. (Cl. 96—28)

This invention relates to processes for image reproduction, and more particularly to processes for forming images which utilize photopolymerizable laminated elements.

Various processes for producing copies of images utilizing photopolymerizable elements are known. However, they are limited in the scope of their application and in their versatility. For example, some elements of the prior art require special equipment such as heated pressure rollers for the production of images. This is because said elements depend on high temperatures to soften the photopolymerizable composition to its stick temperature in order to effect transfer of the unexposed polymerizable material which forms the image. Dimensional fidelity of the reproduced images is sometimes a problem because of the temperature changes involved. This disadvantage has been largely overcome by the process described in assignee's Colgrove application, U.S. Ser. No. 375,629, filed June 6, 1964, now abandoned. This process comprises exposing imagewise through a transparent support and then separating at room temperature, a laminated photopolymerizable element comprising two supports, one of which is transparent, and having different adhesive forces for polymerized and unpolymerized photomerizable compositions. One of the supports must be modified, for example, by having a matte surface as in engineering drafting film. In practice, an original image, such as an engineering drawing, is placed on the transparent support and the photopolymerizable laminated element exposed to actinic light through said drawing. Upon separation of supporting films, a polymerized negative remains on the transparent support and an unpolymerized positive of the original adheres to the matte surface of the support farthest from the exposing light source.

The difficulty with the above process is that it is limited in its application and does not allow the production of a positive on, for example, a translucent engineering drafting film from a photographic negative of an original image. This is due to the fact that unpolymerized material has a greater affinity for the matte surface of the drafting film than it does for the transparent support. Further, it does not permit the use of a laminated photopolymerizable element wherein both supports are the same, that is, both supports are unmodified transparent films of the same composition. This is because the adhesive forces cannot be varied in a suitable manner, so that the image of choice adheres to the support of choice. To illustrate, if one were to expose a negative to the structure as described in Example I of the above Colgrove application, a negative would be found on the translucent drafting film. If the element were exposed through the drafting film with the negative in contact with the laminated drafting film support, no image would result because both the polymerized positive image and the unpolymerized negative area would adhere to the drafting film surface.

It has now been found possible to utilize the photopolymerizable laminated structures described in the Colgrove application in an improved manner to carry out a new negative-positive process, and also, to utilize a laminated element comprising like supports. In addition, it has been found possible to produce halftone positives from continuous tone negatives and to vary the contrast of the resulting images.

It is therefore an object of this invention to provide new and improved processes for forming images by photopolymerization. A further object is to provide photopolymer image reproduction processes which are operable at room or elevated temperatures and may be used with a minimum of apparatus. A still further object is to provide processes for image reproduction in laminated photopolymerizable elements whereby the image of choice (positive or negative) may be formed on the support of choice. A further object is to provide such processes whereby the contrast of the image may be varied in a simple manner. Other objects will appear hereinafter.

The above objects are accomplished in the process of this invention which comprises exposing a laminated photopolymerizable element comprising (A) two supports both of which can be transparent, translucent or a combination of both type supports, and, (B) a thin photopolymerizable stratum therebetween, first from one side of the element with an imagewise exposure to actinic radiation, and then from the opposite side with an over-all or halftone screen exposure to actinic radiation. Said exposures may also be made in the reverse order, that is, the over-all or screen exposure may be made first and then the imagewise exposure. The laminated element is then peeled apart at room temperature or elevated temperature, depending on the characteristics desired in the reproduced images, to give clear, sharp images on each of the supports, a complementary image of the original being adhered to the support nearest the imagewise exposing radiation and an image of the same sign as the original on the support farthest from said imagewise exposing radiation.

The improvement in the process which allows markedly greater versatility in the reproduction of images in photopolymerizable elements is due to the discoverey that the adhesion of the photopolymerizable compositions to the laminated surfaces can be controlled by actinic radiation in a simple manner. The adhesion can be controlled at will, e.g., the more exposure through a support layer, the greater will be the adhesive force of the exposed photopolymer for said support. This does not require that the surfaces of one or both of the supports be modified (i.e., matted) to control the adhesion as described in the above Colgrove application. However, those unsymmetrical laminated elements comprising transparent and/or translucent films described in said application may also be used in the instant process as well as symmetrical elements which have like transparent or translucent supports on each side of the photopolymerizable composition.

The photopolymerizable stratum may comprise any of the photopolymerizable compositions disclosed in assignee's Plambeck, U.S. Patent 2,760,863, issued August 29, 1956, which are solid and non-tacky at room temperature. In addition to the ethylenically unsaturated compounds containing at least one terminal ethylenic group as exemplified by the monomers described in the Plambeck patent, other monomeric compounds such as those described in assignee's Celeste and Seide, U.S. patent application, Ser. No. 274,909, filed Apr. 23, 1963, U.S. patent 3,261,686, and assignee's Cohen and Schoenthaler, U.S. patent application, Ser. No. 370,338, filed May 26, 1964, may be used. Materials to serve as coating and laminating supports may include a wide variety of transparent and translucent synthetic polymeric sheets, fibrous sheets such as transparentized papers, i.e., glassine, etc. Both supports preferably should have a low permeability to oxygen.

Suitable elements for use in the process are made by coating on a support as described above, a photopolymerizable composition comprising a polymeric binder and an ethylenically unsaturated monomer preferably having a molecular weight of at least 295, in a ratio of from about 10 to not more than 70 parts of monomer per 100 parts of binder-monomer composition and containing an addition polymerization initiator, activatable by actinic radiation, in an amount of 0.001 to 20 parts by weight of the components. The composition also may contain a colorant such as particulate material and/or dye matter to provide an optical density in the images produced by the process. For example, colloidal carbon, titanium dioxide, barium sulfate and various colored pigments may be used as particulate materials. Various organophilic silicas, colloidal alumina, bentonites, colloidal silicas and powdered glass can also be admixed with colored dyes and pigments. The layers preferably are coated to give a thickness of from 0.00002 to .0005 inch. Thicker layers may be used but in general no advantages accrue therefrom and some loss in image quality may result.

After coating, a second film which is the same or different from the first film is laminated to the surface of the photopolymerizable layer at temperatures ranging from 50° C. to 150° C. and pressures from 40 to 150 pounds per square inch. The second film may have a matte surface in the form of an auxiliary coating or formed integrally with the film, said matte surface being in contact with the photopolymerizable composition.

The element is exposed imagewise by means of a photographic negative to actinic radiation through the support on which it is desired to have the corresponding positive image. The exposure may be, but is not necessarily, by means of a light source which is rich in ultraviolet radiation passing through a halftone image transparency, e.g., process negative or positive (an image-bearing transparency consisting solely of substantially opaque and substantially transparent areas where the opaque areas are substantially of the same optical density). Engineering drawings are also to be considered in the purview of the above description as are continuous tone photographic negatives. The image or transparency may or may not be in contact with the surface of the photopolymerizable laminated element, e.g., contact or projection exposure systems may be used. Both exposure times (imagewise exposure and flash exposure) required will range from a few tenths of a second to several minutes depending on the intensity of the exposing radiation, the inherent photographic speed of the composition and whether the exposure is through a clear transparent support or a translucent support. After the imagewise exposure the element is given an over-all exposure to actinic radiation through the side opposite that which received the imagewise exposure. After the over-all flash exposure, the laminated element is separated by peeling apart at any temperature in the range of from about 15° C. to 150° C. For best results the supports are separated at a moderate rate of about 0.1 to 25 inches per second. A good clear positive of excellent quality will be found on the film support which was nearest to the negative and image exposing radiation, and a negative image will be found on the support which was the more remote from the image exposing radiation.

The flash (over-all) exposure is of such duration (dependent upon light intensity and composition of the photopolymer and support) that any unexposed photopolymer in contact with the support through which the flash is made is polymerized to increase its adhesion to said support; however, the flash exposure should not be of such magnitude as to cause photopolymerization to a degree where the adhesion at the opposite support due to the polymer formed by the flash exposure is equal to or greater than the adhesion of said polymer to the support through which the flash exposure is made. Thus, if over-all exposure is accomplished first, the photopolymer will still be sufficiently unpolymerized at the opposite support to receive the imagewise exposure and produce good copies. If the imagewise exposure is accomplished first, the image exposed portions will adhere to the support through which it is exposed and leaving corresponding unexposed areas which will adhere to the opposite support when given an over-all exposure through the opposite support.

As indicated above, film supports on which the photopolymerizable composition is coated, and which may be used for laminating, include a wide variety of substantially transparent and translucent films. Films composed of high polymers, e.g., polyamides, polyolefins, polyesters, vinyl polymers, and cellulosics. Specific high polymer films from the above classes include: polyamides, i.e., polyhexamethylene sebacamide, polyhexamethylene adipamide, polyethylene, polypropylene, polyesters, i.e., polyethylene terephthalate, polyethylene terephthalate/isophthalate copolymers of British Patent 766,290, vinyl acetals, vinylidene chloride copolymerized with vinyl chloride, styrene, and acrylonitrile, cellulose acetate, cellulose acetate/butyrate, viscose rayon, etc. Suitable translucent supports include any of the above films wherein the surface is coated with a layer containing a particulate material to impart matte characteristics. The particulate material may also be incorporated in the film itself to provide a matte surface. Suitable translucent films include the drafting films described and claimed in assignee's Van Stappen, U.S. Patent 2,964,423, dated Dec. 13, 1960, Centa et al., U.S. Patent 3,115,420, dated Dec. 24, 1963, and Van Stappen, U.S. patent application, Ser. No. 29,580, filed May 17, 1960 now U.S. Patent 3,227,576. The above patents and patent application comprise a polyester support having thereon a layer containing a particulate material. In the above patents, the layer comprises a urea-formaldehyde resin having dispersed therein a solid inorganic toothing agent having an average particulate size from 0.1 to 10.0 microns. In the above Van Stappen application, the particulate material consists of polyamide or interpolyamide resins in discrete particulate form of 0.1 to 10 microns in size. The film supports of Alles et al., U.S. 2,627,088 are also suitable. The films disclosed and claimed therein comprise a polyester film having on the surface thereof as an anchoring layer, a copolymer containing at least 35% vinylidene chloride, the remainder comprising an acrylic acid ester and itaconic acid. Other surface treatments which are suitable include flame treating, treatment with electrostatic discharge, and also with chromic acid.

The photopolymerizable compositions may comprise any suitable binder and an ethylenically unsaturated monomer. In addition, the composition will contain a polymerization initiator activatable by actinic radiation and a particulate material and/or a coloring matter. The composition may also contain an addition polymerization inhibitor and/or thermal inhibitor. The binder may be of the same general type as the polymerizable monomer being used and may be soluble therein and plasticized thereby, although this is not a critical requirement. Polymeric binders which have been found to be suitable include polymethyl methacrylate, methyl methacrylate copolymerized with methacrylate acid.

Ethylenically unsaturated monomers capable of addition polymerization which have been found especially suitable are those disclosed in assignee's Celeste and Seide, U.S. patent application, Ser. No. 274,909, filed Apr. 23, 1963 now U.S. Patent 3,261,686, representative of which are pentaerythritol diacrylate and triacrylate and trimethylacrylate and dipentaerythritol tetraacrylate. Other polymerization monomers include polyethylene glycol (M.W. 300–600) diacrylates and methacrylates and the reaction products of trimethylolpropane, ethylene oxide and acrylic and methacrylic acids as disclosed in assignee's Cohen and Schoenthaler, U.S. patent application, Ser. No. 370,338, filed May 26, 1964.

The invention will now be further illustrated by, but is not intended to be limited to, the following detailed examples.

EXAMPLE I

The following photopolymerizable composition was prepared:

| | Grams |
|---|---|
| Polymethyl methacrylate (inherent viscosity: 0.20–0.22 for a solution of 0.25 gram in 50 mils chloroform at 20° C., using a No. 50 Cannon-Fenske viscosimeter) | 26.3 |
| Triacrylate of the reaction product of trimethylol propane with 20 moles of ethylene oxide | 33.7 |
| Fast Black, T.W., powder (available from Verona Dyestuffs, Union, N.J.) | 29.0 |
| Methoxypolyethylene gylcol hydrogen succinate (in which the polyethylene oxide ether precursor had an average molecular weight of 750) | 4.2 |
| 9,10-phenanthrenequinone | 6.8 |
| Trichloroethylene to make | 800.0 |

The resulting dispersion was coated on a 0.001 inch transparent polyethylene terephthalate film to give a dry coating thickness of approximately 0.0001–0.00015 inch and having an optical density of 1.8. To the surface of the photopolymerizable layer there was then laminated a sheet of translucent drafting film manufactured in the manner of Example I of Van Stappen, U.S. Patent 2,964,423. The lamination was carried out at a temperature of 120° C. and a pressure of about 50 pounds per square inch.

The element was exposed for 7.4 seconds through a lithographic negative in contact with the translucent drafting film support by means of a "Revolute Rockette" (Type R6A) exposing device. After this imagewise exposure, the element was given an over-all exposure of 2.8 seconds through the transparent support side in the above apparatus. After the overall exposure, the laminated element was peeled apart at room temperature (about 25° C.). A good, clear positive copy of the negative was adhered to the translucent drafting film.

EXAMPLE II

Example I was repeated except that the element was given a five-minute imagewise exposure on a "NuArc" Plate Maker, flip-top, Model FT–26M–2. This device uses a carbon arc as a light source. The over-all exposure through the transparent support in the same device was for 2 minutes. A good, clear positive of the original negative was obtained on the translucent drafting film when peeled from the transparent support at room temperature.

EXAMPLE III

The element of Example I was exposed as described in that example to a lithographic paper negative by means of an "Ozalid" Print Master 810 at an exposure of 11.0 seconds. An over-all exposure of 3.6 seconds was made through the transparent support. A good, clear positive copy of the original negative was obtained on the translucent drafting film by peeling the element apart at room temperature.

EXAMPLE IV

The following photopolymerizable composition was prepared:

| | Grams |
|---|---|
| Polymethyl methacrylate (of Example I) | 30 |
| Triacrylate monomer (of Example I) | 35 |
| Carbon black (particle size 13 millimicrons 15% dispersion in isopropanol) | 40 |
| 9,10-phenanthrenequinone | 4 |
| Trichloroethylene to make | 800 |

The mixture was thoroughly mixed by ball-milling and then coated on a 0.001 inch transparent polyethylene terephthalate film to give a dry coating thickness of 0.00015 inch having an optical density of 1.9. The translucent film described in Example I was then laminated to the surface of the photopolymerizable layer at a temperature of 100° C. and a pressure of about 50 pounds per square inch.

The resulting element was exposed through a lithographic negative in contact with the translucent drafting film support by means of the exposing device described in Example I for 11.0 seconds. An over-all exposure of 1.3 seconds was then given through the transparent polyethylene terephthalate film support. On separating the laminated element by peeling apart at room temperature, an excellent positive copy of the original negative was obtained on the translucent drafting film support. Although the image was hard and non-tacky, parts of it could be removed easily with conventional erasers, or common organic solvents such as acetone and trichloroethylene.

EXAMPLE V

The following photopolymerizable composition was prepared:

| | Grams |
|---|---|
| Polymethyl methacrylate (Example I) | 14 |
| Triacrylate monomer (Example I) | 21 |
| 9,10-phenanthrenequinone | 2 |
| Carbon black dispersion (particle size 27 millimicrons 10% dispersion in trichloroethylene) | 50 |
| Trichloroethylene to make | 500 |

The mixture was thoroughly mixed in a Waring Blendor and then coated on 0.001 inch polyethylene terephthalate and dried to give a dry layer thickness of approximately 0.0002 inch. To the surface of the coated photopolymerizable layer there was laminated at a temperature of 143° C. and 50 pounds per square inch translucent drafting film as described in Example I. The resulting element had an optical density of 1.0.

The element was exposed and peeled apart as described in Example IV to provide an excellent, positive copy of the lithographic negative on the translucent drafting film.

EXAMPLE VI

Example I was repeated and the positive copy obtained on the translucent drafting film was treated with a 3% aqueous colloidal silica dispersion and a mixture of 10 parts of zirconium oxychloride and 30 parts of glycerine in 70 parts of water. Using a conventional fountain solution in an offset duplicating machine (A. B. Dick Offset Duplicator, Model No. 320) 600 good, clear, positive copies were made.

EXAMPLE VII

A laminated photopolymerizable element was made using the photopolymerizable composition and the translucent drafting film of Example I with a clear transparent polypropylene film having a thickness of 0.0008 inch.

The element was exposed as described in Example I using an exposure of 11.0 seconds on the exposing apparatus for both the imagewise exposure and the over-all exposure. Upon peeling the exposed laminated element support at room temperature, a good, clear, positive image was obtained on the drafting film.

EXAMPLE VIII

The laminated element described in Example I was exposed for 9 seconds through a continuous tone negative in contact with the translucent drafting film on the exposing apparatus of Example I. An over-all exposure of 4 seconds was made through the transparent film. The exposed element was peeled apart at a temperature of 116° C. and at a rate of 12 inches per minute. An excellent quality, continuous tone positive was obtained on the translucent drafting film.

EXAMPLE IX

To the surface of the coated photopolymerizable layer, described in Example I, there was laminated at 140° C. a clear polyethylene terephthalate film having a thickness of 0.004 inch in place of the translucent drafting film.

The element was exposed for 9 seconds through a 65-line halftone negative in contact with the surface of the 0.004 inch thick polyethylene terephthalate film in the exposing device of Example I. An over-all exposure of 7 seconds was made through the 0.001 clear film support. On peeling apart the laminated element at room temperature, a positive transparency image of the original negative was obtained on the 0.004 inch thick film and a good negative duplicate was obtained on the 0.001 inch film, each having good resolutions of 65 lines per inch.

EXAMPLE X

The element of Example IX was given an imagewise exposure through a continuous tone negative in contact with the 0.004 inch film for 9 seconds on the exposure apparatus as described in Example I. It was then given an exposure of 9 seconds through a 60-line halftone screen in contact with the 0.004 inch clear film support. The element was then given an over-all exposure of 7 seconds through the 0.001 film support. A good quality, halftone, positive transparency of the original continuous tone negative was obtained on the 0.004 inch clear film support by peeling the supports apart at room temperature.

EXAMPLE XI

The element of Example IX was exposed through a low contrast pencil drawing in contact with the 0.004 inch polyethylene terephthalate film support using the same exposure device and exposure times as described in that example. After the over-all exposure from the opposite side of the element and room temperature separation of the films a good, clear negative was obtained on the 0.004 inch film support from which good positives could be made following the procedures described in Example I. The negative obtained above could be corrected or changed easily by masking.

EXAMPLE XII

The following photopolymerizable compositions were prepared:

| | Grams |
|---|---|
| Polymethyl methacrylate (Example I) | 3.0 |
| * Acrylate monomer | 4.0 |
| 9,10-phenanthrenequinone | 0.8 |
| Methoxypolyethylene glycol hydrogen succinate (see Example I) | 0.5 |
| Fast black powder (see Example I) | 3.0 |
| Trichloroethylene to make | 80.0 |

* Separate photopolymerizable compositions were made using each of the following acrylate monomers: pentaerythritol triacrylate, polyethylene glycol (M.W. 600) diacrylate, triacrylate of oxypropylated trimethylolpropane (M.W. of unesterified ether: 750) and tetraacrylate of oxypropylated pentaerythritol (M.W. of unesterified ether: 600).

The mixtures were ball-milled for 60 hours and then coated on 0.001 inch polyethylene terephthalate films to give dry coating thicknesses of approximately 0.00015 inch. The respective coatings were then laminated at 100° C. and at a pressure of 50 pounds per square inch with the translucent drafting films of the type described in Example I. Exposures of 11 seconds of the respective laminated elements were made using a lithographic negative in contact with the translucent drafting film in the exposing device described in Example I. Over-all exposures of 4 seconds were then made through the clear 0.001 inch film support on the exposing device. Upon delamination of the exposed elements at room temperature, good, clear, positive images were obtained on the translucent drafting film supports.

EXAMPLE XIII

The photopolymerizable composition described in Example I was coated on 0.001 inch thick clear polyethylene terephthalate film and then laminated with a 0.0005 inch thick clear polyethylene terephthalate film in the manner described in Example I. The element was exposed for 9 seconds through a 120-line halftone negative in contact wwith the translucent drafiting film in the exposing device described in Example I. An over-all exposure of the same duration was made through the 0.0005 inch film support. Upon peeling apart the exposed element at room temperature, an excellent 120-line positive was obtained on the 0.001 inch film support.

EXAMPLE XIV

A photopolymerizable dispersion was prepared having the following composition:

| | Grams |
|---|---|
| Polymethyl methacrylate (Example I) | 36 |
| Triacrylate monomer (Example I) | 48 |
| 9,10-phenanthrenequinone | 9.6 |
| Jungle black pigment C.I. 1 | 36 |
| Polyoxyethylene lauryl ether | 6 |
| Trichloroethylene to make | 1042 |

The resulting composition was thoroughly mixed by ball-milling and then coated on 0.001 inch polyethylene terephthalate film to form a dried coating having a thickness of 0.00028 inch. On the surface of the photopolymerizable layer there was laminated at 130° C. and 50 pounds per square inch the translucent drafting film described in Example I. The element had an optical density of 2.27. The laminated element was exposed for 11 seconds through a right-reading lithographic negative in contact with the translucent drafitng film in the exposing device described in Example I. The element was then given an over-all exposure of 1.6 seconds through the clear 0.001 inch film support. Delamination by peeling apart at room temperature provided a good quality right-reading positive on the drafting film and a good, clear, wrong-reading negative on the clear film support.

EXAMPLE XV

Three photopolymerizable compositions differing only in the color on the pigment as indicated below were made as follows:

| | Grams |
|---|---|
| Polymethyl methacrylate (Example I) | 3 |
| Polyethylene glycol (M.W. 600) diacrylate | 45 |
| 9,10-phenanthreneguinone | .4 |
| Pigment: | .6 |
| (Benzidine Yellow AA, Color Index 21090) | |
| (Rhodamine Y, Color Index 45160) | |
| (Monastral Blue G, Color Index 74160) | |
| Trichloroethylene | 71.5 |

The three compositions were individually coated on separate .001 inch polyethylene terephthalate film and laminated with .001 inch polyethylene terephthalate film at 100° C. After laminating, one side of each element was exposed 1.5 seconds to the appropriate 65-line halftone color separation negative on a Bruning Revolute Rockette. An overall exposure of 0.8 second was then made through the other side of each element on the same exposure device. On peeling the elements apart at room temperature colored negative and positive transparencies were obtained to produce three color proofs which could be assembled in register to provide colored pictures.

EXAMPLE XVI

The element of Example IX was given an imagewise exposure of 9 seconds through a continuous tone negative in contact with the 0.004 inch film on the exposure apparatus as described in Example I. It was then given an exposure of 2.8 seconds through a 60-line halftone screen in contact with the 0.001 inch clear film support on the same exposure device. On peeling apart the laminated element at room temperature a good quality, halftone, positive transparency of the original negative was obtained on the 0.004 inch clear film.

EXAMPLE XVII

The element of Example I was given an over-all exposure through the transparent support in the device as described in Example I for 2 seconds. An imagewise exposure was then made through a lithographic negative in contact with the translucent drafting film support for 8 seconds. On peeling apart at room temperature a good clear positive copy of the negative original remained on the surface of the drafting film.

In addition to the binders mentioned above, others included:

(A) Copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and, (5) mixtures of copolyesters prepared from said glycols, and (i) terephthalic, isophthalic and sebacic acids and (ii) terephthalic, isophthalic, sebacic and adipic acids;

(B) Nylons or polyamides, e.g., N-methoxymethyl polyhexamethylene adipamide;

(C) Vinylidene chloride copolymers, e.g., vinylidene chloride/acrylonitrile; vinylidene chloride/methacrylate and vinylidene chloride/vinylacetate copolymers;

(D) Ethylene/vinyl acetate copolymers;

(E) Cellulosic ethers, e.g., methyl cellulose, ethyl cellulose and benzyl cellulose;

(F) Polyethylene;

(G) Synthetic rubbers, e.g., butadiene/acrylonitrile copolymers, and 2-chlorobutadiene-1,3-polymers;

(H) Cellulose esters, e.g., cellulose acetate, cellulose acetates succinate and cellulose acetate butyrate;

(I) Polyvinyl esters, e.g., polyvinyl acetate/acrylate, polyvinyl acetate/methacrylate and polyvinyl acetate;

(J) Polyacrylate and α-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butyral, polyvinyl formula;

(N) Polyformaldehydes;

(O) Polyurethanes;

(P) Polycarbonates;

(Q) Polystyrenes.

In addition to the ethylenically unsaturated monomers mentioned above the following free-radical initiated, chain-propagating, addition polymerizable, ethylenically unsaturated compounds having a molecular weight of at least 295 and which can be used with the above-described polymer compounds include preferably an alkylene or a polyalkylene glycol diacrylate prepared from an alkylene glycol of 2 to 15 carbons or a polyalkylene ether glycol of 1 to 10 ether linkages, and those disclosed in Martin and Barney, U.S. Patent 2,927,022, issued Mar. 1, 1960, e.g., those having a plurality of addition polymerizable ethylenic linkages, particularly when present as terminal linkages, and especially those wherein at least one and preferably most of such linkages are conjugated with a double bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures.

A preferred class of free-radical generating addition polymerization initiators activatable by actinic light and thermally inactive at and below 185° C. includes the substituted or unsubstituted polynuclear quinones which are compounds having two intracyclic carbonyl groups attached to introcyclic carbon atoms in a conjugated carbocyclic ring system. Suitable such initiators include 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone α-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C. are described in Plambeck, U.S. Patent 2,760,863 and include vicinal ketaldonyl compounds, such as diacetyl, benzil, etc.; α-ketaldonyl alcohols, such as benzoin, pivaloin, etc.; acyloin ethers, e.g., benzoin methyl and ethyl ethers, etc.; α-hydrocarbon substituted aromatic acyloins, including α-methylbenzoin, α-allylbenzoin and α-phenylbenzoin. Still other photoinitiating agents include the photo-reducible dyes and reducing agents disclosed in Oster U.S. Patents 2,850,445; 2,875,047; 3,097,096; and Oster et al. U.S. 3,074,794; 3,097,097; and 3,145,104. In addition, dyes of the phenazine, oxazine and quinone classes may be used.

Suitable thermal polymerization inhibitors that can be used in photopolymerizable compositions include phenols, i.e., p-methoxyphenol, tert-butyl catechol, pyrogallol, hydroquinone, and alkyl and aryl-substituted hydroquinones and quinones, copper resinate, naphthylamines, β-naphthol, cuprous chloride, 2,6-di-tert-butyl p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

In addition to colloidal carbon as a particulate material for incorporation in the photopolymerizable composition, the other suitable pigments include, e.g., insoluble salts of dyes and metal complexes of dyes, $TiO_2$, graphite, ceramics, clays, metal powders, such as, aluminum, copper, magnetic iron and iron oxide, and bronze.

The reproduction processes and elements of this invention are useful in many applications. For example, they may be used to make lithographic-offset printing elements because the solid images obtained are substantially resistant to chemical or solvent attack.

The advantages of the invention are many. It allows one to use laminated photopolymerizable elements utilizing a wide variety of transparent and translucent film supports in either symmetrical or unsymmetrical relationship. A major advantage is that the process of the invention allows the technician to place the image of choice on the support of choice and does not depend on a difference in the surface characteristics of the support or stick temperature of the photopolymerizable composition to accomplish this objective. A further advantage is that the process of the invention allows the preparation of a halftone positive image from a continuous tone negative and a halftone negative from a continuous tone positive in a simple and efficient manner. A still further advantage is that it allows the operator to prepare inexpensive negatives and positives in a much less complex manner than the conventional method using gelatino-silver halide emulsion systems. Further, the process offers an inexpensive method of accurately replacing worn and stained original drawings, etc. A still further advantage is that the process offers a method whereby drawings for example can be altered and/or corrected in an easy and simple manner. A still further advantage is that the process offers a method of making inexpensive color proofs in the graphic arts field.

I claim:

1. A process for image reproduction which comprises (A) double exposing a photopolymerizable laminate to actinic radiation by an imagewise exposure through one support of said laminate and an over-all exposure on the opposite support of said laminate, said double exposure being accomplished in either sequence of exposure, and (B) separating said supports of said laminate to obtain a positive image on one support and a negative image on the other support, said laminate comprises a photopolymerizable composition laminated at a temperature of about 50° C. to 150° C. between two actinic radiation permeable supports.

2. A process as described in claim 1 where said supports are both transparent.

3. A process as described in claim 1 where one of said supports is translucent and the opposite support is transparent.

4. A process as defined in claim 3 where said translucent support has a matte surface in contact with said photopolymerizable polymer.

5. A process as defined in claim 1 where said separating of said supports occurs at about 0.1 to 25 inches per second.

6. A process as defined in claim 1 where the thickness of said photopolymerizable composition in said laminate is from 0.00002 to 0.0005 inch thick.

7. A process for image reproduction which comprises (A) double exposing a photopolymerizable laminate to actinic radiation by an imagewise exposure through one support of said laminate and an over-all exposure on the opposite support of said laminate, said double exposure being accomplished in either sequence of exposure, and (B) separating said supports of said laminate to obtain a positive image on one support and a negative image on the other support, said laminate comprises a photopolymerizable composition laminated between two actinic radiation permeable supports at a temperature of about 50° C. to 150° C. and having an ethylenically unsaturated monomer with a molecular weight of at least 295 and a compatible polymeric binder present in a ratio of about 10 to 70 parts per 100 parts of binder-monomer composition.

8. A process as defined in claim 7 where said photopolymerizable composition contains a colorant.

9. A process as defined in claim 7 where said overall exposure is made through a halftone screen.

10. A process as defined in claim 7 where the thickness of said photopolymerizable composition in said laminate is from 0.00002 to 0.0005 inch thick.

11. A process as defined in claim 7 where one of said supports is translucent and the opposite support is transparent.

12. A process as defined in claim 11 where said translucent support is a drafting film.

13. A process for image reproduction which comprises (A) imagewise exposing a photopolymerizable laminate to actinic radiation through one support of said laminate; (B) over-all exposing said laminate through the opposite support to that of said imagewise exposure; and, (C) separating said supports of said laminate to obtain a positive image on one support and a negative image on the other support, said laminate comprises a photopolymerizable composition laminated in a layer of 0.00002 to 0.0005 inch thick between two actinic radiation permeable supports and having an ethylenically unsaturated monomer with a molecular weight of at least 295 and a compatible polymeric binder present in a ratio of about 10 to 70 parts per 100 parts of binder-monomer composition.

14. A process as defined in claim 13 where said supports are both transparent.

15. A process as defined in claim 13 where one of said supports is translucent and the opposite support is transparent.

16. A process as defined in claim 13 where the sequence of said exposures is reversed.

References Cited

UNITED STATES PATENTS

| | | | |
|---|---|---|---|
| 2,760,863 | 8/1956 | Plambeck | 96—115 X |
| 3,060,026 | 10/1962 | Heiart | 96—28 |

NORMAN G. TORCHIN, *Primary Examiner.*

R. E. FICHTER, *Assistant Examiner.*